(12) United States Patent
Manabe et al.

(10) Patent No.: US 11,482,455 B2
(45) Date of Patent: Oct. 25, 2022

(54) CUTTING METHOD OF WORKPIECE BY FORMING REFORMED REGION AND DRY ETCHING PROCESS

(71) Applicants: IWATANI CORPORATION, Osaka (JP); HAMAMATSU PHOTONICS K.K., Shizuoka (JP)

(72) Inventors: Toshiki Manabe, Tokyo (JP); Takehiko Senoo, Amagasaki (JP); Koichi Izumi, Amagasaki (JP); Tadashi Shojo, Amagasaki (JP); Takafumi Ogiwara, Hamamatsu (JP); Takeshi Sakamoto, Hamamatsu (JP)

(73) Assignees: IWATANI CORPORATION, Osaka (JP); HAMAMATSU PHOTONICS K.K., Shizuoka (JP)

( * ) Notice: Subject to any disclaimer, the term of this patent is extended or adjusted under 35 U.S.C. 154(b) by 364 days.

(21) Appl. No.: 16/632,298

(22) PCT Filed: Jul. 18, 2018

(86) PCT No.: PCT/JP2018/026852
§ 371 (c)(1),
(2) Date: Jan. 17, 2020

(87) PCT Pub. No.: WO2019/017368
PCT Pub. Date: Jan. 24, 2019

(65) Prior Publication Data
US 2020/0365461 A1    Nov. 19, 2020

(30) Foreign Application Priority Data
Jul. 20, 2017 (JP) .............................. JP2017-140872

(51) Int. Cl.
*H01L 21/78* (2006.01)
*B23K 26/0622* (2014.01)
(Continued)

(52) U.S. Cl.
CPC .......... *H01L 21/78* (2013.01); *B23K 26/0622* (2015.10); *B23K 26/0643* (2013.01);
(Continued)

(58) Field of Classification Search
CPC ................ B23K 26/53; B23K 2101/40; B23K 2103/56; H01L 21/3065; H01L 21/31055;
(Continued)

(56) References Cited

U.S. PATENT DOCUMENTS 5,536,364 A * 7/1996 Yoshida .............. H01L 21/3081
438/719
2005/0287846 A1   12/2005 Dozen et al.
(Continued)

FOREIGN PATENT DOCUMENTS

JP    2002-151440 A    5/2002
JP    2004-359475 A    12/2004
(Continued)

OTHER PUBLICATIONS

International Search Report issued in PCT/JP2018/026852; dated Oct. 23, 2018.
(Continued)

*Primary Examiner* — John P. Dulka
(74) *Attorney, Agent, or Firm* — Studebaker & Brackett PC

(57) ABSTRACT

A cutting method includes: forming a reformed region in a workpiece; and after forming the reformed region in the workpiece, cutting the workpiece along an intended cut line. In the cutting the workpiece, a dry etching process is performed from a front surface toward a rear surface of the workpiece while the workpiece is fixed on a support member at least under its own weight or by suction, to form a groove from the front surface to reach the rear surface of the workpiece.

2 Claims, 10 Drawing Sheets

(51) Int. Cl.
*B23K 26/364* (2014.01)
*B23K 26/53* (2014.01)
*B23K 26/06* (2014.01)
*B23K 26/08* (2014.01)
*B23K 26/12* (2014.01)
*B23K 26/402* (2014.01)
*H01L 21/268* (2006.01)
*H01L 21/3065* (2006.01)
*B23K 103/00* (2006.01)
*B23K 101/40* (2006.01)

(52) U.S. Cl.
CPC ...... *B23K 26/0648* (2013.01); *B23K 26/0861* (2013.01); *B23K 26/126* (2013.01); *B23K 26/364* (2015.10); *B23K 26/402* (2013.01); *B23K 26/53* (2015.10); *H01L 21/268* (2013.01); *H01L 21/3065* (2013.01); *B23K 2101/40* (2018.08); *B23K 2103/56* (2018.08)

(58) Field of Classification Search
CPC ......... H01L 21/31056; H01L 21/31116; H01L 21/31138; H01L 21/78
See application file for complete search history.

(56) References Cited

U.S. PATENT DOCUMENTS

| | | | |
|---|---|---|---|
| 2006/0032833 A1* | 2/2006 | Kawaguchi | H01L 21/0206 216/37 |
| 2010/0068888 A1 | 3/2010 | Honda et al. | |
| 2010/0136766 A1 | 6/2010 | Sakamoto et al. | |
| 2012/0322236 A1 | 12/2012 | Lei et al. | |
| 2013/0059428 A1 | 3/2013 | Arai | |
| 2014/0248757 A1 | 9/2014 | Morikazu et al. | |
| 2016/0307851 A1* | 10/2016 | Ohura | H01L 21/6836 |

FOREIGN PATENT DOCUMENTS

| | | |
|---|---|---|
| JP | 2006-049851 A | 2/2006 |
| JP | 2010-073815 A | 4/2010 |
| JP | 2013-055120 A | 3/2013 |
| JP | 2013-522884 A | 6/2013 |
| JP | 2014-168790 A | 9/2014 |
| JP | 2016-035965 A | 3/2016 |
| JP | 2016-207737 A | 12/2016 |
| JP | 2017-162856 A | 9/2017 |
| WO | 2008/146744 A1 | 12/2008 |
| WO | 2011/112823 A2 | 9/2011 |

OTHER PUBLICATIONS

An Office Action mailed by Taiwanese Patent Office dated Jun. 21, 2021, which corresponds to Taiwanese Patent Application No. 107124815 and is related to U.S. Appl. No. 16/632,298; with English language translation.

An Office Action mailed by the Japanese Patent Office dated Jul. 6, 2021, which corresponds to Japanese Patent Application No. 2017-140872 and is related to U.S. Appl. No. 16/632,298; with English language translation.

An Office Action mailed by the Korean Intellectual Property Office dated May 27, 2021, which corresponds to Korean Patent Application No. 10-2020-7004267 and is related to U.S. Appl. No. 16/632,298; with English anguage translation.

* cited by examiner

CUTTING METHOD OF WORKPIECE BY FORMING REFORMED REGION AND DRY ETCHING PROCESS

TECHNICAL FIELD

The present invention relates to cutting methods, and more particularly to a cutting method for cutting a workpiece in the form of a plate along an intended cut line.

BACKGROUND ART

There is conventionally known a processing method of applying a laser beam while positioning a point of condensation in a workpiece in the form of a plate to thereby form a reformed region, and then performing an etching process on the reformed region. This processing method is described, for example, in Japanese Patent Laying-Open No. 2004-359475 (PTL 1). In the processing method described in this publication, a wet etching process is used as the etching process performed on the reformed region.

CITATION LIST

Patent Literature

PTL 1: Japanese Patent Laying-Open No. 2004-359475

SUMMARY OF INVENTION

Technical Problem

A cutting method is conceivable in which a workpiece such as a semiconductor substrate is cut using the processing method described in the publication above. In this case, it is conceivable that the semiconductor substrate is cut and divided by an expandable tape. When the semiconductor substrate is cut and divided by the expandable tape, surface roughness and cracks occur in chips, resulting in a decrease in mechanical strength of the chips. Another problem is that if the strength of bonded area between the chips exceeds the strength of adhesion area of the expandable tape during expansion of the semiconductor substrate by the expandable tape, the chips will have defective shapes.

When the chips to be formed from the semiconductor substrate as a workpiece are small in size, it is suitable to employ a dry etching process capable of microfabrication as compared to the wet etching process. When a common dry etching process is used as the etching process performed on the reformed region, etching gas reacts with a base material and an adhesive of an expandable tape. The expandable tape undergoes a chemical change and a thermal change in this reaction, and is thereby deformed in an expanding and contracting manner. This deformation causes application of external stress to the semiconductor substrate, resulting in unintended cutting and dividing of the semiconductor substrate. In addition, a by-product of the reaction of the etching gas and the expandable tape adheres inside a device, resulting in a cleaning operation being created. The reaction of the etching gas and the expandable tape can only be avoided by lowering the pressure of the etching gas and the processing temperature, resulting in inability to ensure a practically applicable etching rate.

The present invention has been made in view of the problem above, and an object of the present invention is to provide a cutting method by which a workpiece can be cut along an intended cut line without an expandable tape.

Solution to Problem

A cutting method of the present invention is for cutting a workpiece in a form of a plate along an intended cut line. The cutting method includes: forming a reformed region in the workpiece along the intended cut line, by applying a laser beam while positioning a point of condensation in the workpiece; and after forming the reformed region in the workpiece, cutting the workpiece along the intended cut line. In the cutting the workpiece, a dry etching process is performed from a front surface toward a rear surface of the workpiece while the workpiece is fixed on a support member at least under its own weight or by suction, to form a groove from the front surface to reach the rear surface of the workpiece.

Advantageous Effects of Invention

According to the cutting method of the present invention, a workpiece can be cut along an intended cut line without an expandable tape.

DESCRIPTION OF EMBODIMENTS

In the following, a cutting method according to an embodiment of the present invention is described with reference to the drawings. Unless otherwise described, the same elements are denoted by the same characters and description thereof will not be repeated.

Figure 1:
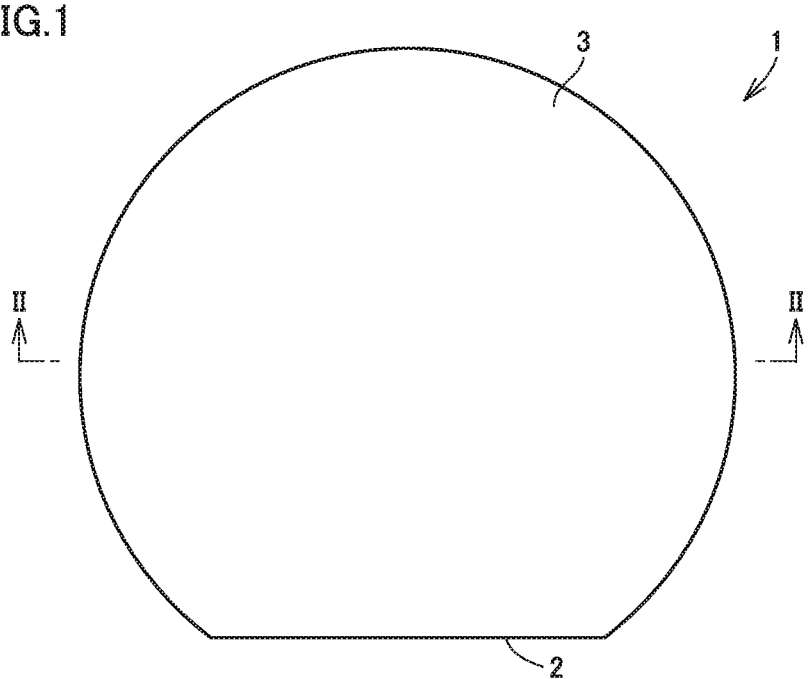
FIG. 1 is a schematic plan view of a workpiece in a cutting method according to an embodiment of the present invention.
Figure 2:
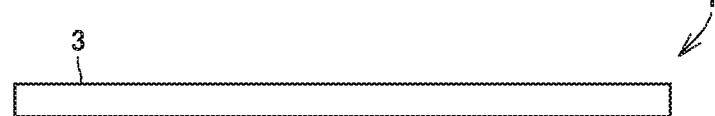
FIG. 2 is a sectional view along the line II-II in FIG. 1.

Referring to FIGS. 1 and 2, a workpiece 1 for the cutting method according to the embodiment of the present invention is prepared. As shown in FIGS. 1 and 2, workpiece 1 is a semiconductor substrate, for example. The following describes the case where workpiece 1 is a semiconductor substrate.

The semiconductor substrate as workpiece 1 is configured to have a substantially disk shape. Workpiece (semiconductor substrate) 1 has an orientation flat 2 provided at its outer circumference. Workpiece (semiconductor substrate) 1 is a silicon (Si) wafer, for example.

A plurality of functional devices (not shown) are provided on a front surface 3 of workpiece (semiconductor substrate) 1. In other words, workpiece (semiconductor substrate) 1 includes a substrate body, and the plurality of functional devices disposed on a front surface of the substrate body. The functional devices are, for example, semiconductor operating layers formed by crystal growth, light-receiving devices such as photodiodes, light-emitting devices such as laser diodes, or circuit elements formed as a circuit. The plurality of functional devices are provided in a matrix in directions parallel to and perpendicular to orientation flat 2 of the semiconductor substrate.

Referring now to FIGS. 3 to 10, the formation of a reformed region in the cutting method according to the embodiment of the present invention is described. First, a laser processing apparatus 100 for use in the formation of the reformed region is described.

Figure 3:
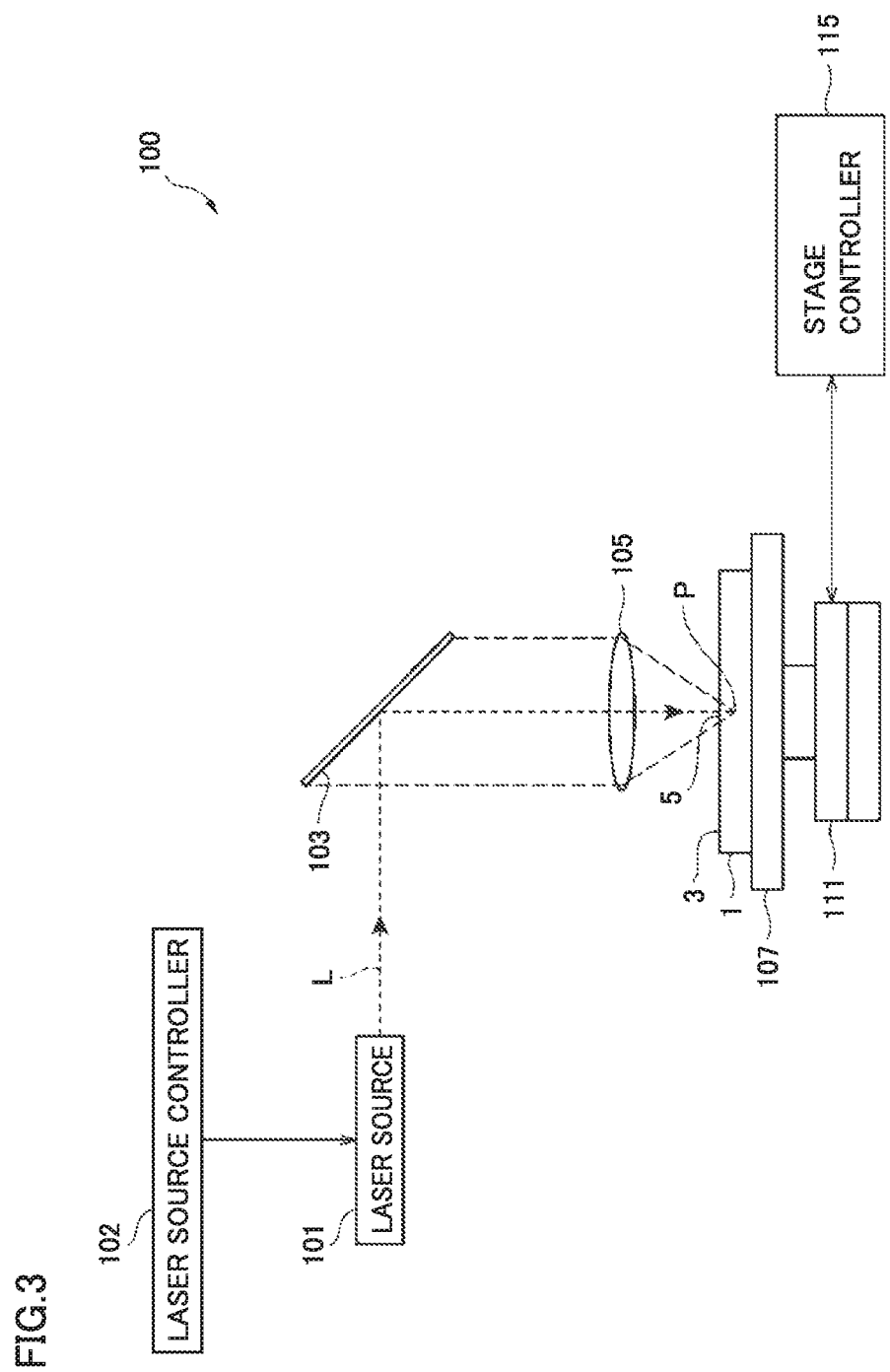
FIG. 3 is a schematic configuration diagram of a laser processing apparatus for use in the formation of reformed regions in the cutting method according to the embodiment of the present invention.

As shown in FIG. 3, laser processing apparatus 100 includes: a laser source 101 to cause pulse oscillation of a laser beam (processing laser beam) L; a dichroic mirror 103 arranged to change the orientation of an optical axis of laser beam L by 90°; and a condenser lens 105 for condensing laser beam L. Laser processing apparatus 100 also includes: a support table 107 for supporting workpiece (semiconductor substrate) 1 irradiated with laser beam L condensed by condenser lens 105; a stage 111 for moving support table 107 in X, Y and Z directions; a laser source controller 102 to control laser source 101 in order to adjust output, pulse width and the like of laser beam L; and a stage controller 115 to control the movement of stage 111.

In this laser processing apparatus 100, laser beam L emitted from laser source 101 is changed in orientation of its optical axis by 90° by dichroic mirror 103, and condensed by condenser lens 105 into workpiece (semiconductor substrate) 1 placed on support table 107. At the same time, stage 111 is moved, causing workpiece (semiconductor substrate) 1 to move along an intended cut line relative to laser beam L. As a result, a reformed region serving as a starting point of cutting is formed in workpiece (semiconductor substrate) 1 along an intended cut line 5. This reformed region is described in detail below.

Figure 4:
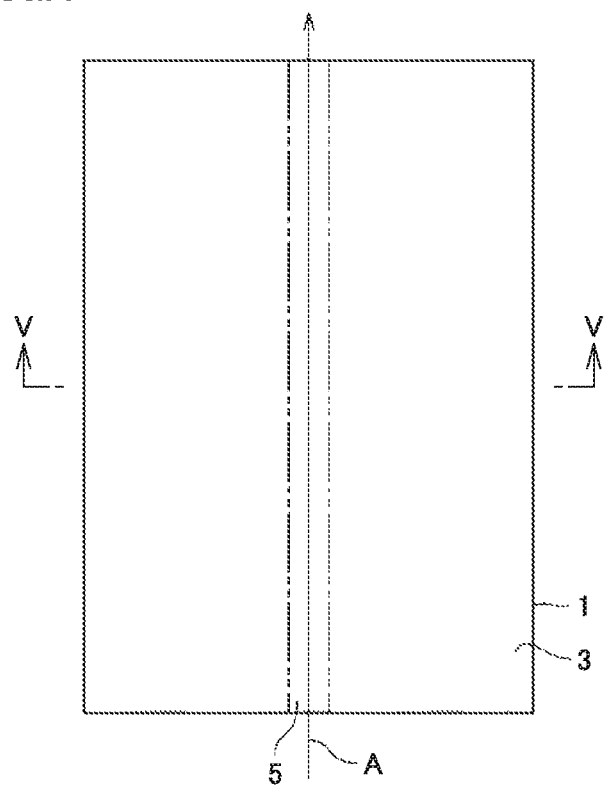
FIG. 4 is a schematic plan view of the workpiece in which the reformed regions are to be formed in the cutting method according to the embodiment of the present invention.
Figure 5:
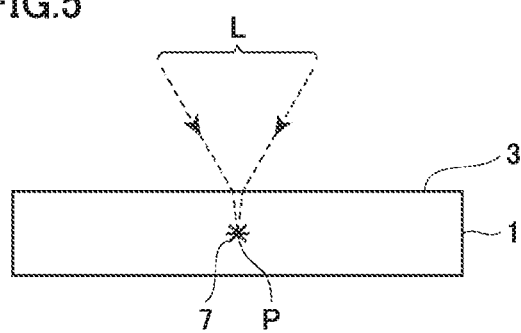
FIG. 5 is a sectional view along the line V-V in FIG. 4.
Figure 6:
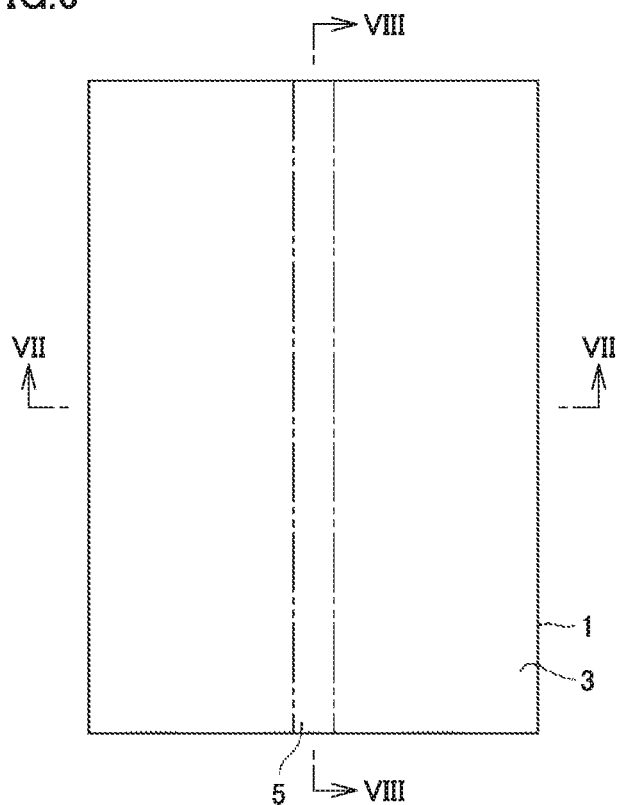
FIG. 6 is a schematic plan view of the workpiece after laser processing in the cutting method according to the embodiment of the present invention.
Figure 7:
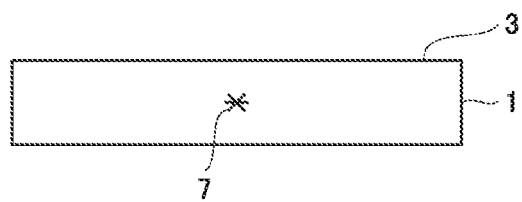
FIG. 7 is a sectional view along the line VII-VII in FIG. 6.
Figure 8:
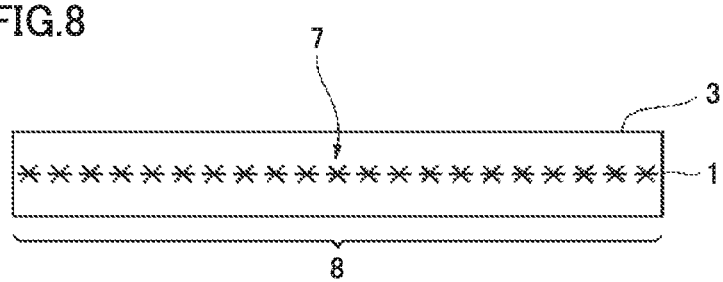
FIG. 8 is a sectional view along the line VIII-VIII in FIG. 6.

As shown in FIG. 4, workpiece (semiconductor substrate) 1 in the form of a plate is provided with intended cut line 5 along which workpiece (semiconductor substrate) 1 is to be cut. Intended cut line 5 is a linearly extending imaginary line. When forming the reformed region within workpiece 1, laser beam L is relatively moved along intended cut line 5 (namely, in the direction of an arrow A in FIG. 4), while a point of condensation P is positioned within workpiece (semiconductor substrate) 1, as shown in FIG. 5. As a result, as shown in FIGS. 6 to 8, a reformed region 7 is formed within workpiece (semiconductor substrate) 1 along intended cut line 5, and reformed region 7 formed along intended cut line 5 serves as a cutting starting point region 8.

It should be noted that point of condensation P is a spot where laser beam L is condensed. Intended cut line 5 may be curved instead of being linear, or may be a line actually drawn on front surface 3 of workpiece 1 instead of being the imaginary line. Reformed region 7 may be formed continuously or intermittently. Reformed region 7 should only be formed at least within workpiece 1. Cracks may originate from reformed region 7, and the cracks and reformed region 7 may be exposed at an outer surface (front surface, rear surface, or outer circumferential surface) of workpiece 1.

Reformed region 7 refers to a region whose density, refractive index, mechanical strength or other physical properties have been altered from those of a surrounding region. Examples include a melt processing region, a crack region, a dielectric breakdown region, a refractive-index-changed region, and also a region having a mixture of these regions.

Referring again to FIG. 3, workpiece (semiconductor substrate) 1 is fixed on support table 107 of laser processing apparatus 100. Then, with front surface 3 of workpiece (semiconductor substrate) 1 as a laser beam incident surface, laser beam L is applied while point of condensation P is positioned within workpiece (semiconductor substrate) 1, and point of condensation P is scanned, by the movement of support table 107, along intended cut lines 5 arranged in a lattice pattern so as to extend through adjacent functional devices. In addition, point of condensation P is scanned on intended cut line 5 along a thickness direction of workpiece (semiconductor substrate) 1.

Figure 9:
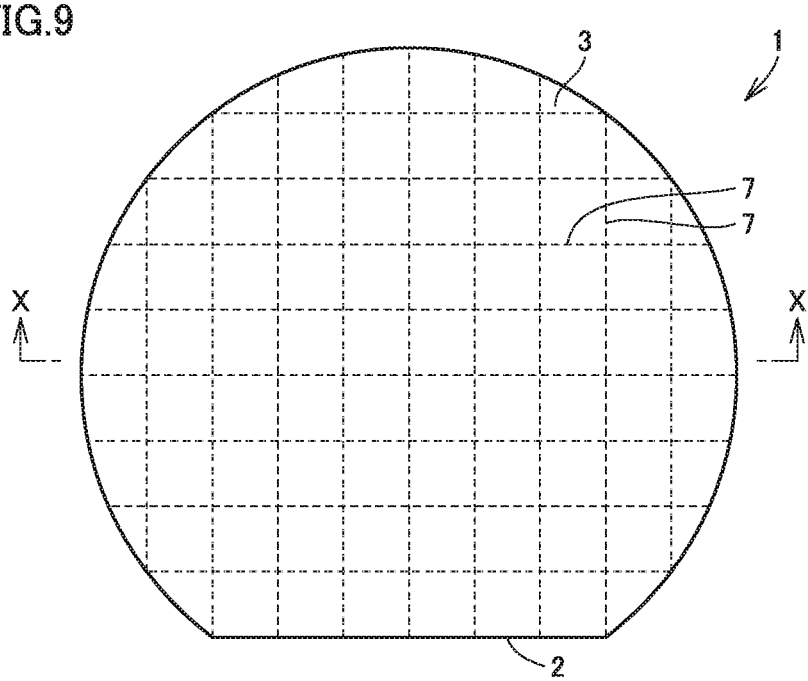
FIG. 9 is a schematic plan view of the workpiece after the reformed regions have been formed in the cutting method according to the embodiment of the present invention.
Figure 10:
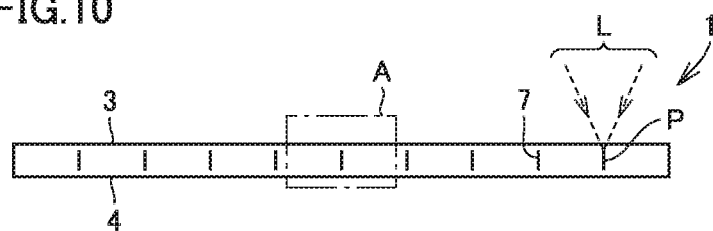
FIG. 10 is a sectional view along the line X-X in FIG. 9.

As a result, as shown in FIG. 9, reformed regions 7 are formed in a lattice pattern in workpiece (semiconductor substrate) 1. Each reformed region 7 is formed within workpiece (semiconductor substrate) 1 from the front surface 3 side to a rear surface 4 side of workpiece (semiconductor substrate) 1, as shown in FIG. 10. In other words, reformed region 7 is formed in the thickness direction of workpiece (semiconductor substrate) 1.

Referring now to FIGS. 11 to 16, the formation of a groove 9 in the cutting method according to the embodiment of the present invention is described. First, an etching apparatus 200 for use in the formation of groove 9 is described.

Figure 11:
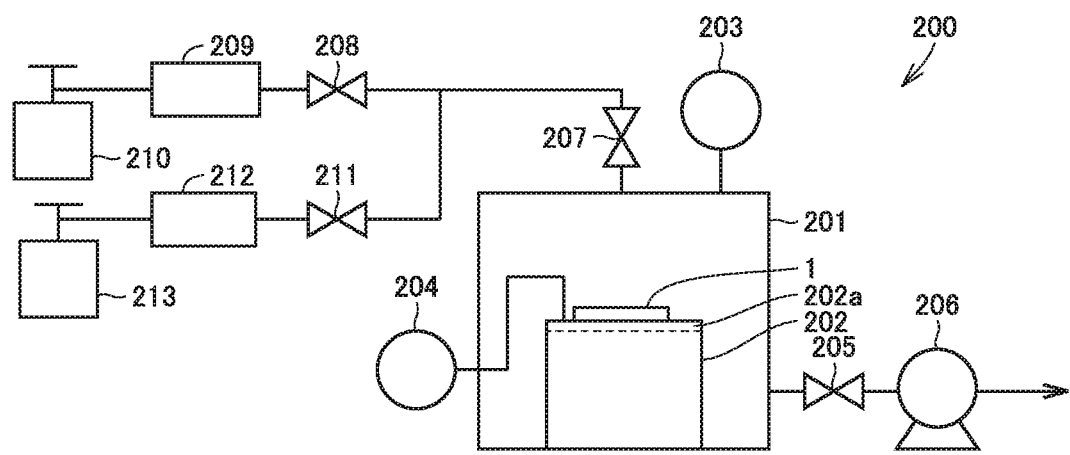
FIG. 11 is a schematic configuration diagram of an etching apparatus for use in the formation of grooves in the cutting method according to the embodiment of the present invention.

As shown in FIG. 11, etching apparatus 200 includes a chamber 201, a stage (support member) 202, a manometer 203, a thermometer 204, a valve 205, a vacuum pump 206, a valve 207, a valve 208, a flow rate controller 209, a first gas supply device 210, a valve 211, a flow rate controller 212, and a second gas supply device 213.

In etching apparatus 200, chamber 201 is configured to accommodate workpiece (semiconductor substrate) 1 in which reformed regions 7 have been formed. Workpiece (semiconductor substrate) 1 is placed on stage 202 disposed in chamber 201. Workpiece (semiconductor substrate) 1 is fixed on stage 202 under its own weight. Stage 202 may include a suction device 202a. In this case, workpiece (semiconductor substrate) 1 is fixed on stage 202 by being sucked by suction device 202a. Suction device 202a is an electrostatic chuck or a vacuum chuck, for example. In other words, workpiece (semiconductor substrate) 1 is fixed on stage 202 at least under its own weight or by suction. Stage 202 is configured to have an adjustable temperature. Stage 202 is heated with workpiece (semiconductor substrate) 1 being placed thereon, causing workpiece (semiconductor substrate) 1 to be heated to a temperature equal to that of stage 202.

Chamber 201 is connected to manometer 203 for measuring the pressure in chamber 201. Stage 202 is connected to thermometer 204 for measuring the temperature of workpiece 1 based on the temperature of stage 202. Thermometer 204 is connected to stage 202, and measures the temperature of stage 202 to thereby measure the temperature of workpiece (semiconductor substrate) 1 that has been heated to the same temperature as stage 202. Chamber 201 is connected by piping to vacuum pump 206 via valve 205. Vacuum pump 206 is a turbo molecular pump or a mechanical booster pump, for example.

Chamber 201 is connected by piping to first gas supply device 210 via valve 207, valve 208 and flow rate controller 209. First gas supply device 210 is configured to supply an etching gas. Chamber 201 is also connected by piping to second gas supply device 213 via valve 207, valve 211 and flow rate controller 212. Second gas supply device 213 is configured to supply an etching gas. The etching gas supplied from second gas supply device 213 may be the same as or different from the etching gas supplied from first gas supply device 210. Valve 205, valve 207, valve 208 and valve 211 are each an electronic regulating valve, for example. Flow rate controllers 209, 212 are each a mass flow meter, for example.

While etching apparatus 200 includes second gas supply device 213 in addition to first gas supply device 210 in FIG. 11, etching apparatus 200 may include only first gas supply device 210. In other words, etching apparatus 200 may include only one gas supply device. Alternatively, etching apparatus 200 may include three or more gas supply devices.

Figure 12:
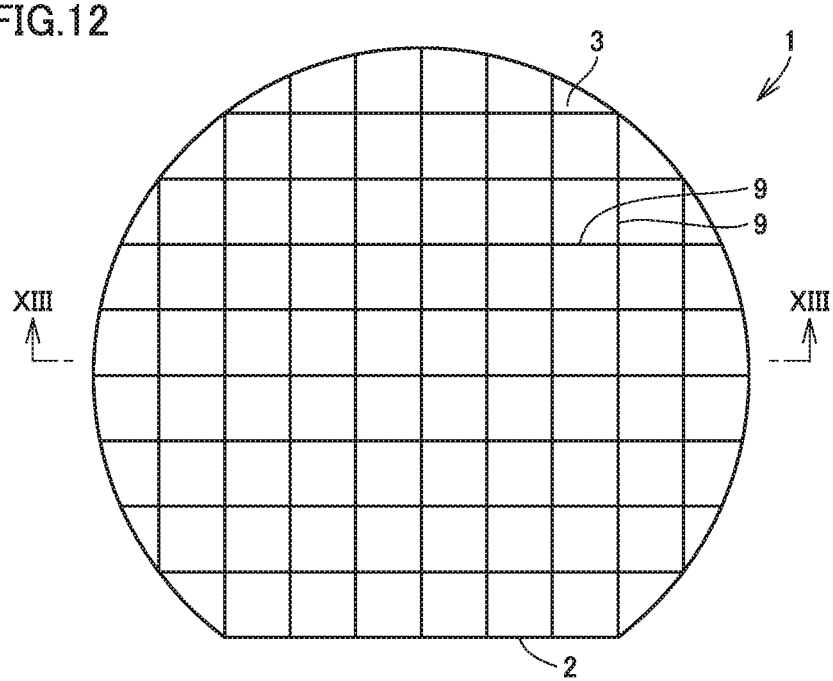
FIG. 12 is a schematic plan view of the workpiece after the grooves have been formed in the cutting method according to the embodiment of the present invention.
Figure 13:
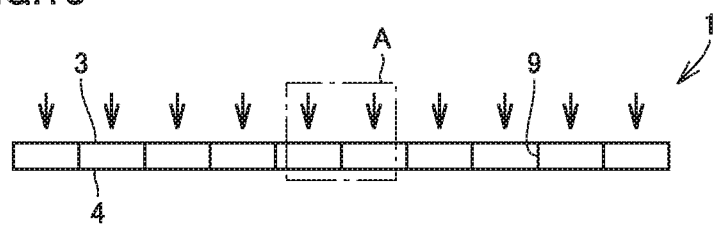
FIG. 13 is a sectional view along the line XIII-XIII in FIG. 12.

As shown in FIGS. 12 and 13, a dry etching process is performed from front surface 3 toward rear surface 4 of workpiece (semiconductor substrate) 1 in etching apparatus 200. The dry etching process is an anisotropic dry etching process using a mixed gas of sulfur hexafluoride ($SF_6$), octafluorocyclobutane ($C_4F_8$) and oxygen ($O_2$), for example. Front surface 3 of workpiece (semiconductor substrate) 1 is thereby etched. Here, in workpiece (semiconductor substrate) 1, reformed region 7 made of polycrystalline silicon, for example, has a higher etching rate than a non-reformed region made of monocrystalline silicon, for example, and therefore, groove 9 is formed in front surface 3 of workpiece (semiconductor substrate) 1 along intended cut line 5. The dry etching process may be performed with a photoresist formed on the functional devices, for example. This photoresist is removed upon completion of the dry etching process.

The dry etching process is performed from front surface 3 toward rear surface 4 of workpiece (semiconductor substrate) 1 while workpiece (semiconductor substrate) 1 is fixed on stage 202 at least under its own weight or by suction, to form groove 9 from front surface 3 to reach rear surface 4 of workpiece (semiconductor substrate) 1.

Figure 14:
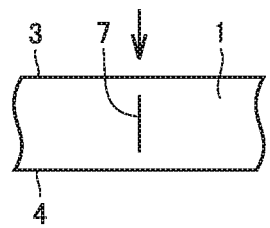
FIG. 14 is an enlarged sectional view of a region A in FIG. 10.
Figure 15:
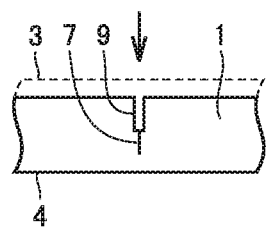
FIG. 15 is an enlarged sectional view illustrating a dry etching process performed on region A in FIG. 10.
Figure 16:
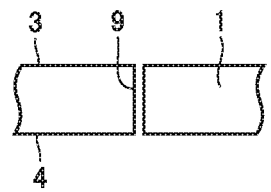
FIG. 16 is an enlarged sectional view illustrating the workpiece that has been cut in region A in FIG. 10.

Further, referring to FIGS. 14 to 16, the formation of groove 9 is described in detail. FIGS. 14 to 16 correspond to a region A enclosed by a chain-dotted line in FIGS. 10 and 13.

As shown in FIG. 14, after reformed region 7 has been formed in workpiece (semiconductor substrate) 1, workpiece (semiconductor substrate) 1 is cut along intended cut line 5 shown in FIG. 4. In other words, as shown in FIG. 15, a dry etching process is performed on workpiece (semiconductor substrate) 1 from front surface 3 toward rear surface 4 of workpiece (semiconductor substrate) 1. Front surface 3 of workpiece (semiconductor substrate) 1 is etched by the dry etching process. Further, groove 9 is formed partway into reformed region 7 from front surface 3 toward rear surface 4 of workpiece (semiconductor substrate) 1.

As shown in FIG. 16, the dry etching process is further performed to etch front surface 3 of workpiece (semiconductor substrate) 1. Further, groove 9 is formed from front surface 3 to reach rear surface 4 of workpiece 1. In this manner, workpiece (semiconductor substrate) 1 is cut along reformed region 7. In the state shown in FIGS. 12 and 13, the distance between chips formed of workpiece (semiconductor substrate) 1 that has been cut is substantially zero.

Figure 17:
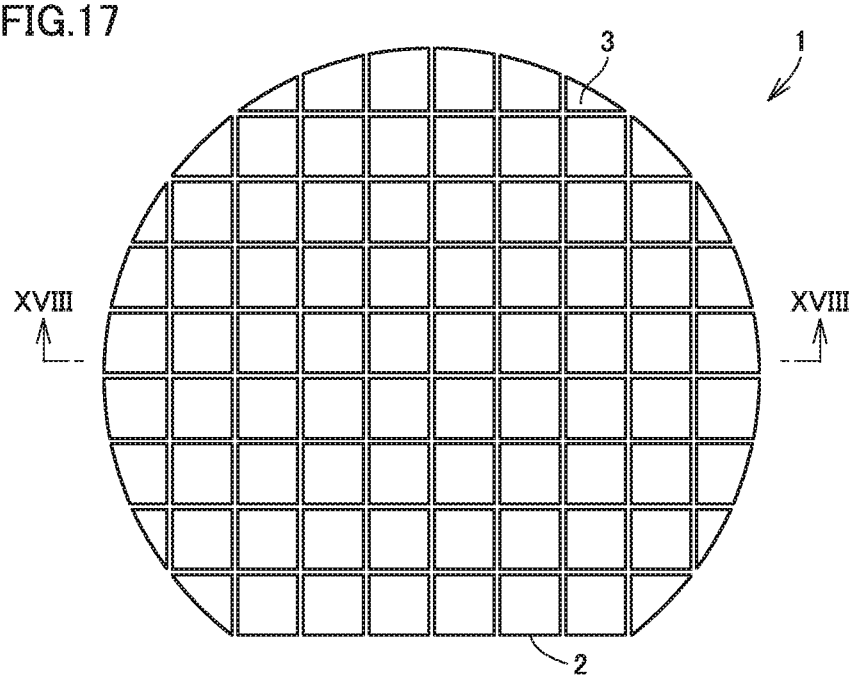
FIG. 17 is a schematic plan view of the workpiece after division.
Figure 18:
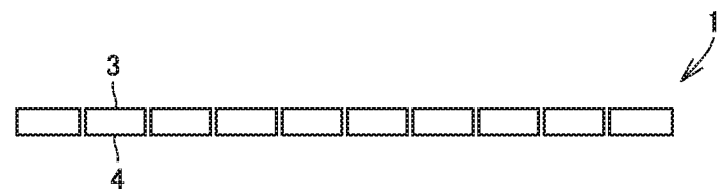
FIG. 18 is a sectional view along the line XVIII-XVIII in FIG. 17.

Next, referring to FIGS. 17 and 18, workpiece (semiconductor substrate) 1 that has been cut is divided into chips. In other words, the distance between the chips is increased. In the state shown in FIGS. 17 and 18, the distance between the chips is maintained at at least a prescribed distance. The distance between the chips should only be a distance suitable for the next step. After the cutting, workpiece (semiconductor substrate) 1 may be transferred to an expandable tape, which may then be expanded to divide workpiece (semiconductor substrate) 1.

Next, etching gases for use in the dry etching processes in the cutting method according to the embodiment of the present invention are described in detail.

A halogen-based etching gas may be used for the dry etching process. A halogen-based etching gas may be used for each of the first to the nth dry etching processes. The halogen-based etching gas may include at least one of chlorine trifluoride ($ClF_3$), nitrogen trifluoride ($NF_3$), sulfur hexafluoride ($SF_6$), fluorine ($F_2$), chlorine ($Cl_2$), hydrogen bromide (HBr), carbon tetrafluoride ($CF_4$), octafluorocyclobutane ($C_4F_8$), methane trifluoride ($CHF_3$) and boron trichloride ($BCl_3$). In other words, the halogen-based etching gas may be either a single gas or a mixed gas including these materials. The halogen-based etching gas may be a mixed gas of octafluorocyclobutane ($C_4F_8$) and oxygen ($O_2$), for example.

Next, function and effect of the cutting method according to the embodiment of the present invention will be described.

According to the cutting method in the embodiment of the present invention, after reformed region 7 has been formed in workpiece (semiconductor substrate) 1, workpiece (semiconductor substrate) 1 is cut along intended cut line 5. The dry etching process is performed from front surface 3 toward rear surface 4 of workpiece (semiconductor substrate) 1 while workpiece (semiconductor substrate) 1 is fixed on stage 202 at least under its own weight or by suction, to form groove 9 from front surface 3 to reach rear surface 4 of workpiece (semiconductor substrate) 1. As a result, workpiece (semiconductor substrate) 1 is cut along intended cut line 5.

Therefore, an expandable tape is not used for cutting and dividing workpiece (semiconductor substrate) 1. Thus, the occurrence of surface roughness and cracks in chips by the expandable tape to result in a decrease in mechanical strength of the chips can be prevented. In addition, since the strength of bonded area between the chips does not exceed the strength of adhesion area of the expandable tape, the occurrence of defective shapes of the chips by the expandable tape can be prevented. In addition, a reaction of the etching gas and a base material and an adhesive of the expandable tape, which causes the expandable tape to undergo a chemical change and a thermal change and to be thereby deformed in an expanding and contracting manner, can be prevented. Accordingly, application of external stress to workpiece (semiconductor substrate) 1 by this deformation to result in unintended cutting and dividing of workpiece (semiconductor substrate) 1 can be prevented. In addition, since a by-product of the reaction of the etching gas and the expandable tape does not adhere inside a device, the creation of a cleaning operation can be prevented. In addition, since the etching gas does not react with the expandable tape, it is not necessary to lower the pressure of the etching gas and the processing temperature. Accordingly, a practically applicable etching rate can be ensured.

If workpiece (semiconductor substrate) 1 is transferred to the expandable tape for division after the cutting, the processing time is extended due to the transfer step. However, the number of active species that react with reformed region 7 increases by raising the pressure of the etching gas, whereby the etching rate can be improved. As a result, the time spent on the etching can be significantly shortened, whereby the overall processing time can be shortened.

According to the cutting method in the embodiment of the present invention, a halogen-based etching gas can be used for the dry etching process.

According to the cutting method in the embodiment of the present invention, as the halogen-based etching gas, at least one of chlorine trifluoride ($ClF_3$), nitrogen trifluoride ($NF_3$), sulfur hexafluoride ($SF_6$), fluorine ($F_2$), chlorine ($Cl_2$), hydrogen bromide (HBr), carbon tetrafluoride ($CF_4$), octafluorocyclobutane ($C_4F_8$), methane trifluoride ($CHF_3$) and boron trichloride ($BCl_3$) can be used.

Figure 19:
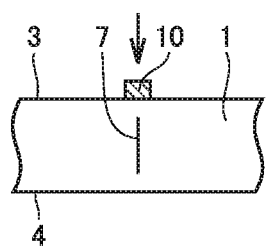
FIG. 19 is a schematic sectional view of a TEG formation region in the workpiece after laser processing in the cutting method according to the embodiment of the present invention.
Figure 20:
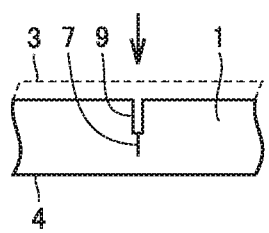
FIG. 20 is an enlarged sectional view illustrating a dry etching process performed on the TEG formation region in FIG. 19.

Next, various variations of the cutting method according to the embodiment of the present invention are described. A first variation of the cutting method according to the embodiment of the present invention is described first. As the first variation, referring to FIGS. 19 and 20, a TEG (Test Element Group) 10 may be formed on the intended cut line of workpiece (semiconductor substrate) 1. In this case, at least one of tungsten (W), titanium (Ti), titanium nitride (TiN) and molybdenum (Mo) may be used as a material for TEG 10. In other words, in this case, workpiece (semiconductor substrate) 1 includes the substrate body, the functional devices (not shown) and TEG 10.

Therefore, the material for workpiece 1 may include at least one of silicon (Si), tungsten (W), titanium (Ti), titanium nitride (TiN) and molybdenum (Mo). In this case, in the step of cutting workpiece 1, the dry etching process may be performed using a plasmaless chlorine trifluoride ($ClF_3$) gas as the halogen-based etching gas, at a pressure of not less than 10 Pa and not more than 90 kPa (abs) and at a temperature of not less than the boiling point of each fluoride in the material and less than 200° C. Referring again to FIG. 11, this pressure is the pressure in chamber 201. This temperature is the temperature of workpiece 1.

The pressure is set to not less than 10 Pa because the etching rate decreases due to a decrease in etching reaction rate when the pressure is less than 10 Pa. The pressure is set to not less than 10 Pa also because it takes time to set the pressure to less than 10 Pa using vacuum pump 206. The pressure is set to not less than 10 Pa also because the amount of a remaining reaction by-product discharged from groove 9 when the pressure is set to less than 10 Pa remains substantially unchanged from the amount when the pressure is set to 10 Pa. The pressure is set to not less than 10 Pa also because a mechanical booster pump, not a turbo molecular pump, can be used to set the pressure to 10 Pa. The pressure is set to not more than 90 kPa because it is difficult to set the pressure to higher than 90 kPa in a vacuum device. With the plasmaless chlorine trifluoride ($ClF_3$) gas, the etching can be performed over a pressure range of not less than 10 Pa and not more than 90 kPa (abs). For this reason, the range of pressure is set to not less than 10 Pa and not more than 90 kPa (abs). The chlorine trifluoride ($ClF_3$) gas can etch silicon (Si), tungsten (W), titanium (Ti), titanium nitride (TiN) and molybdenum (Mo). For this reason, silicon (Si), tungsten (W), titanium (Ti), titanium nitride (TiN) and molybdenum (Mo) are used as the material for the workpiece. The temperature is set to not less than the boiling point of each fluoride in the material for workpiece 1 because the etching rate in each material can be ensured by such setting. The temperature is set to less than 200° C. because a maximum temperature during dicing of the devices formed on workpiece 1 is 200° C.

In the first variation of the cutting method according to the embodiment of the present invention, the material for workpiece 1 may include at least one of silicon (Si), tungsten (W), titanium (Ti), titanium nitride (TiN) and molybdenum (Mo). In this case, in the step of cutting workpiece 1, the dry etching process may be performed using a plasmaless chlorine trifluoride ($ClF_3$) gas as the halogen-based etching gas, at a pressure of not less than 10 Pa and not more than 90 kPa (abs) and at a temperature of not less than the boiling point of each fluoride in the material and less than 200° C. As a result, workpiece 1 including at least one of silicon (Si), tungsten (W), titanium (Ti), titanium nitride (TiN) and molybdenum (Mo) can be etched.

Next, a second variation of the cutting method according to the embodiment of the present invention is described. As the second variation, an insulating film may be formed on the intended cut line of the workpiece. In this case, at least one of silicon dioxide ($SiO_2$), silicon oxynitride (SiON) and silicon nitride (SiNx) may be used as a material for the insulating film. It should be noted that SiNx may vary in composition ratio (x) around $Si_3N_4$ in which a ratio of the number of atoms (composition) forming a SiN compound exists according to the chemical formula. The value of x may be not less than 1.0 and not more than 1.5, for example. In this case, the workpiece (semiconductor substrate) includes the substrate body, the functional devices and the insulating film.

Therefore, the material for the workpiece may include at least one of silicon dioxide ($SiO_2$), silicon oxynitride (SiON) and silicon nitride (SiNx). In this case, in the step of cutting the workpiece, the dry etching process may be performed with anhydrous hydrogen fluoride (HF) added to the halogen-based etching gas. The etching gas including anhydrous hydrogen fluoride (HF) added to the halogen-based etching gas can etch silicon dioxide ($SiO_2$), silicon oxynitride (SiON) and silicon nitride (SiNx). For this reason, the etching gas includes anhydrous hydrogen fluoride (HF) added to the halogen-based etching gas.

In the second variation of the cutting method according to the embodiment of the present invention, the material for the workpiece may include at least one of silicon dioxide ($SiO_2$), silicon oxynitride (SiON) and silicon nitride (SiNx). In this case, in the step of cutting the workpiece, the dry etching process may be performed with anhydrous hydrogen fluoride (HF) added to the halogen-based etching gas. As a result, workpiece 1 including at least one of silicon dioxide ($SiO_2$), silicon oxynitride (SiON) and silicon nitride (SiNx) can be etched.

In the plurality of plasmaless dry etching processes in the first variation and the second variation of the cutting method according to the embodiment of the present invention described above, volume density of gas molecules may be varied within a range of not less than 10 times and not more than 10000 times as compared to volume density during a pressure-reducing process immediately preceding each dry etching process.

Next, a third variation of the cutting method according to the embodiment of the present invention is described. As the third variation, a TEG and an insulating film may be formed on the intended cut line of the workpiece. In this case, at least one of tungsten (W), titanium (Ti), titanium nitride (TiN) and molybdenum (Mo) may be used as a material for the TEG, and at least one of silicon dioxide ($SiO_2$), silicon oxynitride (SiON) and silicon nitride (SiNx) may be used as a material for the insulating film.

Therefore, the material for the workpiece may include at least one of silicon (Si), tungsten (W), titanium (Ti), titanium nitride (TiN), molybdenum (Mo), silicon dioxide ($SiO_2$), silicon oxynitride (SiON) and silicon nitride (SiNx). In this case, in the step of cutting the workpiece, the dry etching process may be performed using at least one of carbon tetrafluoride ($CF_4$), sulfur hexafluoride ($SF_6$), methane trifluoride ($CHF_3$), hydrogen fluoride (HF) and oxygen ($O_2$) in a plasma state as the etching gas, at a pressure of not less than 10 Pa and not more than 0.8 kPa (abs) and at a temperature of less than 200° C. This pressure is the pressure in the chamber. This temperature is the temperature of the workpiece.

The carbon tetrafluoride ($CF_4$), sulfur hexafluoride ($SF_6$), methane trifluoride ($CHF_3$), hydrogen fluoride (HF) and oxygen ($O_2$) in a plasma state can etch silicon (Si), tungsten (W), titanium (Ti), titanium nitride (TiN), molybdenum (Mo), silicon dioxide ($SiO_2$), silicon oxynitride (SiON) and silicon nitride (SiNx). For this reason, silicon (Si), tungsten (W), titanium (Ti), titanium nitride (TiN), molybdenum (Mo), silicon dioxide ($SiO_2$), silicon oxynitride (SiON) and silicon nitride (SiNx) are used as the material for the workpiece. The pressure is set to not more than 0.8 kPa (abs) because maximum output in remote plasma has a pressure of 0.8 kPa.

In the third variation of the cutting method according to the embodiment of the present invention, the material for the workpiece may include at least one of silicon (Si), tungsten (W), titanium (Ti), titanium nitride (TiN), molybdenum (Mo), silicon dioxide ($SiO_2$), silicon oxynitride (SiON) and silicon nitride (SiNx). In this case, in the step of cutting the workpiece, the dry etching process may be performed using at least one of carbon tetrafluoride ($CF_4$), sulfur hexafluoride ($SF_6$), methane trifluoride ($CHF_3$), hydrogen fluoride (HF) and oxygen ($O_2$) in a plasma state as the etching gas, at a pressure of not less than 10 Pa and not more than 0.8 kPa (abs) and at a temperature of less than 200° C. As a result, the workpiece including at least one of silicon (Si), tungsten (W), titanium (Ti), titanium nitride (TiN), molybdenum (Mo), silicon dioxide ($SiO_2$), silicon oxynitride (SiON) and silicon nitride (SiNx) can be etched.

Next, a fourth variation of the cutting method according to the embodiment of the present invention is described. As the fourth variation, an aluminum film and a TEG may be formed on the intended cut line of the workpiece. In this case, aluminum (Al) may be used as a material for the aluminum film, and at least one of tungsten (W), titanium (Ti), titanium nitride (TiN) and molybdenum (Mo) may be used as a material for the TEG.

Therefore, the material for the workpiece may include at least one of aluminum (Al), silicon (Si), tungsten (W), titanium (Ti), titanium nitride (TiN) and molybdenum (Mo). In this case, in the step of cutting the workpiece, the dry etching process may be performed using at least one of chlorine ($Cl_2$), hydrogen bromide (HBr), hydrogen chloride (HCl) and boron trichloride ($BCl_3$) in a plasma state as the etching gas, at a pressure of not less than 10 Pa and not more than 0.8 kPa (abs) and at a temperature of less than 200° C. This pressure is the pressure in the chamber. This temperature is the temperature of the workpiece.

The chlorine ($Cl_2$), hydrogen bromide (HBr), hydrogen chloride (HCl) and boron trichloride ($BCl_3$) in a plasma state can etch aluminum (Al), silicon (Si), tungsten (W), titanium (Ti), titanium nitride (TiN) and molybdenum (Mo). For this reason, aluminum (Al), silicon (Si), tungsten (W), titanium (Ti), titanium nitride (TiN) and molybdenum (Mo) are used as the material for the workpiece.

In the fourth variation of the cutting method according to the embodiment of the present invention, the material for the workpiece includes at least one of aluminum (Al), silicon (Si), tungsten (W), titanium (Ti), titanium nitride (TiN) and molybdenum (Mo). In the step of cutting the workpiece, the dry etching process may be performed using at least one of chlorine ($Cl_2$), hydrogen bromide (HBr), hydrogen chloride (HCl) and boron trichloride ($BCl_3$) in a plasma state as the etching gas, at a pressure of not less than 10 Pa and not more than 0.8 kPa (abs) and at a temperature of less than 200° C. As a result, the workpiece including at least one of aluminum (Al), silicon (Si), tungsten (W), titanium (Ti), titanium nitride (TiN) and molybdenum (Mo) can be etched.

In the plurality of dry etching processes in plasma discharge in the third variation and the fourth variation of the cutting method according to the embodiment of the present invention described above, the pressure may be varied within a range of not less than 10% and not more than 100% as compared to during a pressure-reducing process immediately preceding each dry etching process.

In the case of downstream plasma processing in which a gas discharge space and a substrate-installed space are partitioned by a discharging pressure control valve, pressure in the substrate-installed space may be varied within a range of not less than $1/10$ and not more than $1/10000$ of pressure in the gas discharge space, while the discharge pressure is maintained constant.

It should be understood that the embodiments disclosed herein are illustrative and non-restrictive in every respect. The scope of the present invention is defined by the terms of the claims, not by the description above, and is intended to include any modifications within the meaning and scope equivalent to the terms of the claims.

REFERENCE SIGNS LIST 1 workpiece; 3 front surface; 4 rear surface; 5 intended cut line; 7 reformed region; 9 groove; 100 laser processing apparatus; 200 etching apparatus; 201 chamber; 202 stage; 203 manometer; 204 thermometer; 205, 207, 208, 211 valve; 206 vacuum pump; 209, 212 flow rate controller; 210 first gas supply device; 213 second gas supply device.

The invention claimed is:

1. A cutting method for cutting a workpiece in a form of a plate along an intended cut line, the cutting method comprising:

forming a reformed region in the workpiece along the intended cut line, by applying a laser beam while positioning a point of condensation in the workpiece; and after forming the reformed region in the workpiece, cutting the workpiece along the intended cut line, in the cutting the workpiece, a dry etching process being performed from a front surface toward a rear surface of the workpiece while the workpiece is fixed on a support member at least under its own weight or by suction, to form an opening from the front surface to reach the rear surface of the workpiece, wherein in the cutting the workpiece, a halogen-based etching gas is used for the dry etching process, a material for the workpiece includes at least one of silicon, tungsten, titanium, titanium nitride and molybdenum, and in the cutting the workpiece, the dry etching process is performed using a plasmaless chlorine trifluoride gas as the halogen-based etching gas, at a pressure of not less than 10 Pa and not more than 90 kPa (abs) and at a temperature of not less than a boiling point of each fluoride in the material and less than 200° C.

2. The cutting method according to claim 1, wherein the material for the workpiece includes at least one of silicon dioxide, silicon oxynitride and silicon nitride, and in the cutting the workpiece, the dry etching process is performed with anhydrous hydrogen fluoride added to the halogen-based etching gas.

* * * * *